United States Patent
Tang et al.

(10) Patent No.: US 11,868,013 B2
(45) Date of Patent: Jan. 9, 2024

(54) CHIP ON FILM, DISPLAY PANEL, AND METHOD OF MANUFACTURING DISPLAY PANEL

(71) Applicant: HKC CORPORATION LIMITED, Shenzhen (CN)

(72) Inventors: Li Tang, Shenzhen (CN); Baohong Kang, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 2 days.

(21) Appl. No.: 17/955,571

(22) Filed: Sep. 29, 2022

(65) Prior Publication Data
US 2023/0213822 A1 Jul. 6, 2023

(30) Foreign Application Priority Data
Dec. 30, 2021 (CN) .......................... 202111655107.6

(51) Int. Cl.
G02F 1/1345 (2006.01)
G02F 1/133 (2006.01)
G02F 1/1362 (2006.01)
H01L 27/12 (2006.01)
H01L 25/00 (2006.01)
(Continued)

(52) U.S. Cl.
CPC ...... *G02F 1/13452* (2013.01); *G02F 1/13306* (2013.01); *G02F 1/13456* (2021.01); *G02F 1/136286* (2013.01); *G09G 3/035* (2020.08); *G09G 3/3685* (2013.01); *H01L 23/49838* (2013.01); *H01L 23/5386* (2013.01); *H01L 25/50* (2013.01); *H01L 27/124* (2013.01); *H01L 23/4985* (2013.01); *H01L 23/5387* (2013.01); *H01L 25/18* (2013.01)

(58) Field of Classification Search
CPC ...................... G02F 1/13306; G02F 1/136286
See application file for complete search history.

(56) References Cited

U.S. PATENT DOCUMENTS

2007/0109484 A1* 5/2007 Murahashi .......... G02F 1/13452
349/149
2021/0293993 A1* 9/2021 Kim ..................... G02B 5/0278
2021/0397281 A1* 12/2021 Gupta ................. G02F 1/13336

FOREIGN PATENT DOCUMENTS

CN 101354486 A 1/2009
CN 102033341 A 4/2011
(Continued)

OTHER PUBLICATIONS

Chinese first office action, Application No. 202111655107.6, dated Jul. 5, 2022(12 pages).

*Primary Examiner* — Sherman Ng

(57) ABSTRACT

A chip on film, a display panel, and a method of manufacturing the display panel are provided. The chip on film includes a flexible film and a driver chip. The flexible film includes at least a first group of lines and a second group of lines. M lines of the first group of lines are electrically connected to pins of the driver chip to form driver lines; and N lines of the second group of lines are not electrically connected to any pin of the driver chip, serving as nominal lines. By arranging the nominal lines, a conventional bonding machine may be applied to bond the chip on film to the display substrate. Costs for modifying the bonding machine may be reduced, and application scenarios of the chip on film may be increased.

7 Claims, 7 Drawing Sheets

(51) Int. Cl.
*H01L 23/538* (2006.01)
*G09G 3/36* (2006.01)
*G09G 3/00* (2006.01)
*H01L 23/498* (2006.01)
*H01L 25/18* (2023.01)

(56) References Cited

FOREIGN PATENT DOCUMENTS

| | | | |
|---|---|---|---|
| CN | 108681415 | A | 10/2018 |
| CN | 208805661 | U | 4/2019 |
| CN | 110967880 | A | 4/2020 |
| CN | 112748613 | A | 5/2021 |
| CN | 113130612 | A | 7/2021 |
| CN | 113707700 | A | 11/2021 |

* cited by examiner

US 11,868,013 B2

CHIP ON FILM, DISPLAY PANEL, AND METHOD OF MANUFACTURING DISPLAY PANEL

CROSS REFERENCE TO RELATED APPLICATIONS

The present application claims priority of the Chinese patent application No. 2021116551076, filed on Dec. 30, 2021, the entire contents of which are hereby incorporated by reference in their entireties.

TECHNICAL FIELD

The present disclosure relates to the field of displaying, and in particular to a chip on film, a display panel, and a method of manufacturing a display panel.

BACKGROUND

In the art, in addition to common resolution of a LCD, a display having special resolution to meet demands of various fields may be available. While manufacturing a display having special resolution, data lines on a display substrate may be evenly or non-evenly matched with common driver chips, such that the number of data lines assigned to the chip on film may be different from the number of outer lead bonding (OLB) lines that are commonly used in the art. For example, the number of OLB lines that are commonly used in the art may be 720/726/960/966/1026.

However, when bonding a chip on film having the uncommon number of OLB lines to the display substrate, a common bonding machine may not be used for bonding since the number of OLB lines of the chip on film is different from the number of lines of a common chip on film. However, modifying the bonding machine to accommodate chip on films having the uncommon numbers of OLB lines may cause high modification costs, increase production costs.

SUMMARY OF THE DISCLOSURE

According to a first aspect of the present disclosure, a chip on film is provided and includes a flexible film and a driver chip. The flexible film comprises at least a first group of lines and a second group of lines; M lines of the first group of lines are electrically connected to pins of the driver chip to form driver lines; and N lines of the second group of lines are not electrically connected to any pin of the driver chip, serving as nominal lines.

According to a second aspect of the present disclosure, a display panel is provided and includes: a display substrate and a plurality of chip on films. The display substrate includes a plurality of array units, the plurality of array units re configured to control a plurality of pixel units to display an image, wherein each of the plurality of array units comprises a plurality of data lines and a plurality of pads. The plurality of chip on films are in one-to-one correspondence with and electrically connected to the plurality of array units to drive the display substrate to display the image, wherein each of the plurality of chip on films is the chip on film as described in the above.

According to a third aspect of the present disclosure, a method of manufacturing a display panel is provided and includes:

providing a plurality of chip on films, wherein each of the plurality of chip on films comprises a flexible film and a driver chip; the flexible film comprises (M+N) outer lead bonding (OLB) wires; the M OLB lines are electrically connected to pins of the driver chip to form driver lines; the N OLB lines are not electrically connected to the pins of the driver chip and serve as nominal lines;

providing a display substrate, wherein the display substrate comprises a plurality of array units, and each of the plurality of array units comprises a plurality of data lines and a plurality of pads;

bonding, by a bonding machine, the plurality of chip on films to the display substrate, wherein the plurality of chip on films are arranged in one-to-one correspondence with the plurality of array units.

BRIEF DESCRIPTION OF THE DRAWINGS

In order to illustrate more clearly the technical solutions in the embodiments of the present disclosure, drawings for describing the embodiments will be described briefly in the following. Apparently, the described drawings show only some of the embodiments of the present disclosure, any ordinary skilled person in the art shall obtain other drawings without any creative work.

Figure 1:
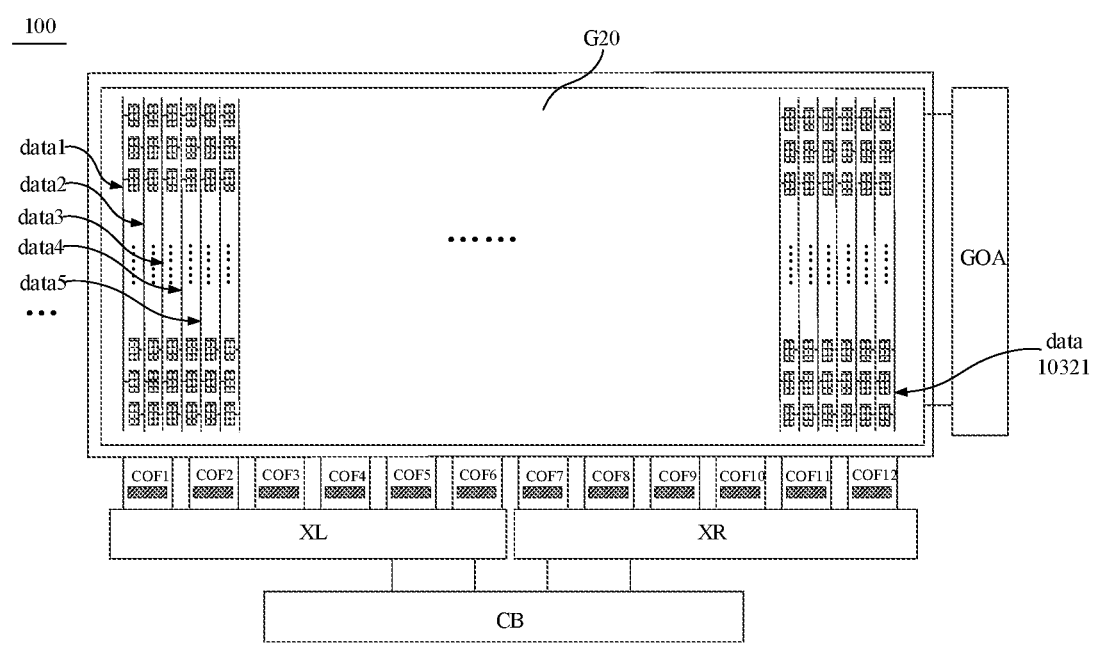
FIG. 1 is a structural schematic view of a display panel according to an embodiment of the present disclosure.

Reference numerals in drawings:

100—display panel; XB—source driver board; XL—first source driver sub-board; XR—second source driver sub-board; GOA—scan driver unit; CB—central control board; G20—display substrate; COF—chip on film; data1~data10321—data lines; COF2~COF11—first chip on film; COF1—second chip on film; COF12—third chip on film; L1—driver line; L2—nominal line; Film—flexible film; IC—driver chip; OLB—outer lead bonding; ILB—inner lead bonding; A2—first array unit; A1—second array unit; A12—third array unit; P1—first driver pad; P11—first nominal pad; P2—second driver pad; P12—second nominal pad; P3—third driver pad; P13—third nominal pad.

DETAILED DESCRIPTION

Technical solutions in the embodiments of the present disclosure will be clearly and completely described below by referring to the accompanying drawings in the embodiments of the present disclosure. Obviously, the described embodiments are only some of but not all of the embodiments of the present disclosure. Based on the embodiments in the present disclosure, all other embodiments obtained by any ordinary skilled person in the art without making creative work shall fall within the scope of the present disclosure.

Terms "first", "second" and "third" herein are used for descriptive purposes only and shall not be interpreted as indicating or implying relative importance or implicitly specifying the number of indicated technical features. Therefore, a feature defined by the "first", "second", or "third" may explicitly or implicitly include at least one such feature. In the description of the present disclosure, "a plurality of" means at least two, such as two, three, and so on, unless otherwise expressly and specifically limited. All directional indications in the present disclosure (such as up, down, left, right, front, rear, . . . ) are used only to explain relative position relationship, movement, and the like, between components at a particular posture (as shown in the drawings). When the posture is changed, the directional indications may change accordingly. In addition, terms "includes" and "has" and any variations thereof are intended to cover non-exclusive inclusion. For example, a process, a method, a system, a product or an apparatus including a series of operations or units is not limited to the listed operations or units, but may further include operations or units that are not listed, or include other operations or units that are inherent to the process, the method, the product or the apparatus.

The "embodiments" of the present disclosure may mean that a particular feature, structure, or property described in an embodiment may be included in at least one embodiment of the present disclosure. Presence of the phrase at various sections in the specification does not necessarily mean a same embodiment, nor is it a separate embodiment or an alternative embodiment that is mutually exclusive with other embodiments. Any ordinary skilled person in the art shall explicitly or implicitly understand that the embodiments described herein may be combined with other embodiments.

The present disclosure will be described in details by referring to the accompanying drawings and embodiments in the following.

As shown in FIG. 1, FIG. 1 is a structural schematic view of a display panel according to an embodiment of the present disclosure. In the present embodiment, the display panel 100 may include a display substrate G20 and a plurality of chip on films COF. The display substrate G20 may include a display region and a non-display region. The plurality of chip on films COF may be connected to the non-display region. The display substrate G20 may include a plurality of array units for controlling a plurality of pixel units to display an image. In detail, the display substrate G20 may include an array substrate, a color film substrate, and a liquid crystal layer disposed between the array substrate and the color film substrate. Each of the array units may be a thin film transistor (TFT) unit on the array substrate. Display substrates G20 having different resolutions may correspond to different numbers of array units. The plurality of array units may include a plurality of first array units A2, a second array unit A1, and a third array unit A12. Each of the plurality of array units may include a plurality of data lines and a plurality of solder pads. The second array unit A1 and the third array unit A12 may be disposed on two opposite sides of the first array unit A2. In detail, the second array unit A1 may be disposed on a left side of the plurality of first array units A2, and the third array unit A12 may be disposed on a right side of the plurality of first array units A2. In some embodiments, the second array unit A1 may be disposed on right side of the plurality of first array units A2, and the third array unit A12 may be disposed on left side of the plurality of first array units A2.

In the present embodiment, for example, the display substrate G20 of the display panel 100 may be in a WQHD type, and resolution of the display panel 100 may be 3440×1440. Since each pixel unit needs three data signals, a data signal R, a data signal G, and a data signal B, and array units on the display substrate G20 may be arranged in a flip architecture, one more data line may be arranged to completely display a last column of pixels. Therefore, there are 10321 data lines on the plurality of array units of the display substrate G20, corresponding to data1~data10321 in FIG. 1.

In the present disclosure, the plurality of chip on films COF are electrically connected to the plurality of array units respectively (i.e., one chip on film connected to one array unit) for driving display substrate G20 to display images. In order to allow the display to be manufactured easily, the plurality of chip on films COF may have a same structure. The plurality of chip on films COF may include a plurality of first chip on films COF2 to COF11, a second chip on film COF1, and a third chip on film COF12. The first chip on films COF2 to COF11 may have a same structure, and in the following description, the first chip on film COF2 may be taken as an example for illustration. The first chip on film COF2 may be arranged corresponding to a first array unit A2 and may be electrically connected to the first array unit A2. The second chip on film COF1 may be arranged corresponding to the second array unit A1 and may be electrically connected to the second array unit A1. The third chip on film COF12 may be arranged corresponding to the third array unit A12 and may be electrically connected to the third array unit A12. Each of the plurality of chip on films COF may include a flexible film Film and a driver chip IC. It shall be understood that the number of the first array units A2 may be equal to the number of the first chip on films COF2. In detail, the number of the plurality of chip on films COF may be determined based on the number of data lines, a model of the arranged driver chip, and an allocation mode of the driver chip IC. In the art, the number of OLB pins of a common driver chip IC may be 720/726/960/966/1026. For example, in the present embodiment, the display panel 100 may be arranged with a driver chip IC having 960 OLB pins, the 10321 data lines on display substrate G20 may be distributed in an uneven manner. In this way, 12 driver chips IC may be required, and that is, 12 chip on films COF may be required, which may be shown as COF1 to COF12 in FIG. 1. The first chip on films are COF2 to COF11. Each first chip on film, such as the chip on film COF2, may be allocated with 864 data lines. The second chip on film COF1 may be allocated with 840 data lines. The third chip on film COF12 may be allocated with 841 data lines. When the first chip on film COF2 corresponds to 864 OLB lines, the second chip on film COF1 corresponds to 840 OLB lines, and the third chip on film COF12 corresponds to 841 OLB lines, the number of OLB lines may not match with the number of OLB lines of a common chip on film. Therefore, a conventional bonding machine may not be applicable to bond the chip on film to the display substrate G20. Therefore, the OLB lines of the chip on film COF need to be re-arranged, such that the number of OLB lines of the chip on film COF may meet the number OLB lines of a common chip on film, and at the same time, the chip on film may drive the display panel 100 to operate properly.

In the present disclosure, the flexible film of each chip on film COF may include a first group of lines and a second group of lines. M lines of the first group of lines may be electrically connected to pins of the driver chip IC to form driver lines L1. N lines of the second group of lines may not be electrically connected to the pins of the driver chip IC and serve as nominal lines L2. That is, the flexible film Film of the chip on film COF may include M driver lines L1 and N nominal lines L2, such that the number of OLB lines of the chip on film COF is (M+N). In the art, the number of OLB lines of the common chip on film may be K. In the present disclosure, N nominal lines L2 may be arranged to allow the number of OLB lines of the chip on film COF to be (M+N), which is equal to K. The value M may be equal to the number of data lines allocated to the chip on film COF, and the value of N may be equal to (K−M).

The N nominal lines L2 may be disposed in a middle of the M driver lines L1. Alternatively, the N nominal OLB lines L2 may be disposed on a same side of the M driver lines L1. Alternatively, the N nominal lines L2 may be disposed on opposite sides of the M driver lines L1. Alternatively, the N nominal lines L2 may be scattered between the M driver lines L1.

Figure 2:
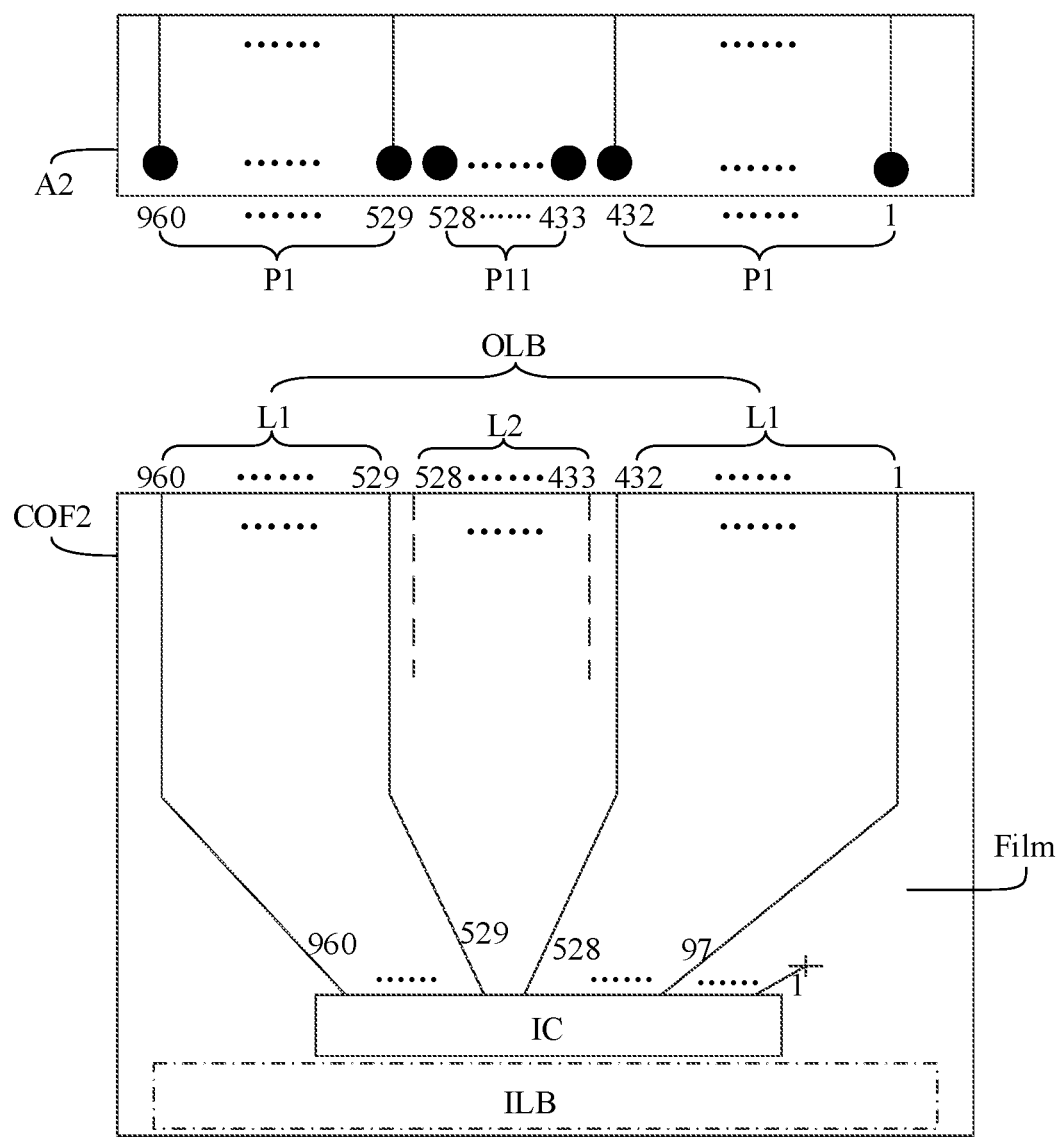
FIG. 2 is a structural schematic view of OLB lines of a first chip on film and a solder pad of a first array unit according to a first embodiment of the present disclosure.

As shown in FIG. 2, FIG. 2 is a structural schematic view of OLB lines of a first chip on film and a solder pad of a first array unit according to a first embodiment of the present disclosure. In the present embodiment, the chip on film COF may be arranged with the driver chip IC having 960 pins, and the K=960. The first chip on film COF2 may be allocated with 864 data lines. The number of the drive lines L2 of the first chip on film COF2 may be M=864, and the number of the nominal lines L2 of the first chip on film COF2 may be N=96. In this way, flexible film Film of the first chip on film COF2 may include (864+96) OLB lines. The 864 OLB lines may be electrically connected to the pins of the driver chip IC to form the driver lines L1 for transmitting signals, and 96 OLB lines may not be electrically connected to the pins of the driver chip IC and may serve as the nominal OLB lines L2. The 96 nominal lines L2 may be disposed in a middle of the 864 driver lines L1. More specifically, the 96 nominal lines L2 may be disposed between one of the driver lines L1 connected to the No. 528 pin of the driver chip IC and another one of the driver lines L1 connected to the No. 529 pin of the driver chip IC. As shown in FIG. 2, the OLB lines of the flexible film Film of the first chip on film COF2 may be arranged as follows: OLB lines from the No. 960 to the No. 529 may be the driver lines L1, OLB lines from the No. 528 to the No. 433 may be the nominal lines L2, and OLB lines from the No. 432 to the No. 1 may be the driver lines L1. According to the present embodiment, 96 nominal OLB lines L2 may be arranged in addition. In this way, the first chip on film COF2 may be the same as the common chip on film having 960 OLB lines, such that the conventional bonding machine may not be modified and may be applicable directly to bond the chip on film of the present application to the display substrate G20. The problem that manufacturing costs may be increased caused by modifying the bonding machine may be avoided.

In some embodiments, the 96 nominal lines L2 may be disposed between any two driver lines L1. For example, the 96 nominal lines L2 may be disposed between a drive line L1 connected to the No. 706 pin of the driver chip IC and a drive line L1 connected to the No. 705 pin of the driver chip IC. In this case, the OLB lines of the flexible film Film of the first chip on film COF2 may be arranged as follows from the left to the right: OLB lines from the No. 960 to the No. 706 may be the driver lines L1, OLB lines from the No. 705 to the No. 610 may be the nominal lines L2, and OLB lines from the No. 609 to the No. 1 may be the driver lines L1. When the N nominal lines L2 are disposed in the middle of the M driver lines L1, the display substrate G20 may be arranged with nominal pads at positions corresponding to the N nominal lines L2, and the number of the nominal pads may be equal to the number of the N nominal lines L2. In this way, lengths of data lines of the display substrate G20 on two sides of the nominal pads may be evenly arranged, and impedance may be evenly distributed, such that uneven charging caused by uneven impedance may be avoided, and image spots may not be shown on the display panel. Therefore, the above arrangement may be preferred. Of course, under certain circumstances, the N nominal lines L2 may not be arranged in the middle of the M driver lines L1.

Figure 3:
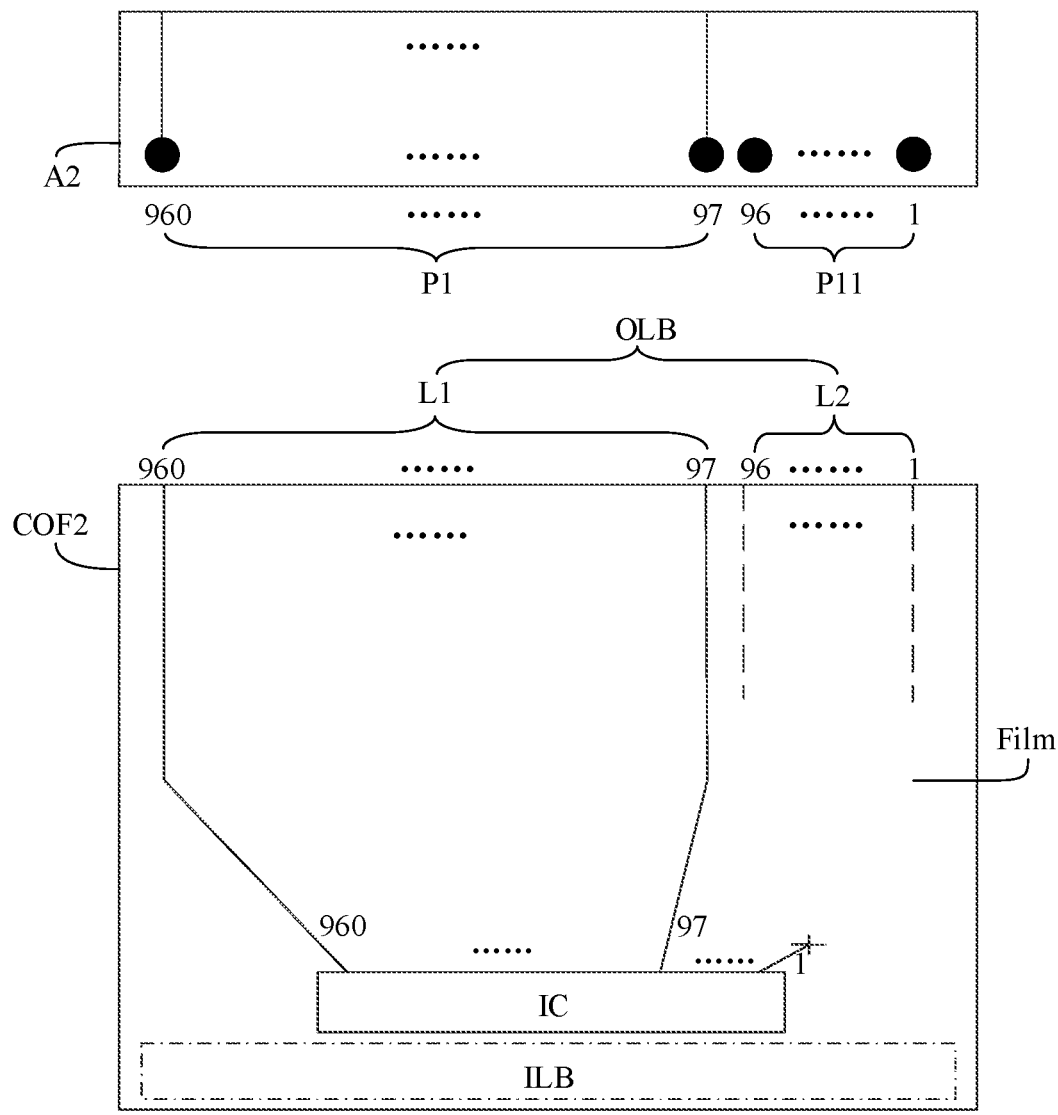
FIG. 3 is a structural schematic view of OLB lines of a first chip on film and a solder pad of a first array unit according to a second embodiment of the present disclosure.
Figure 4:
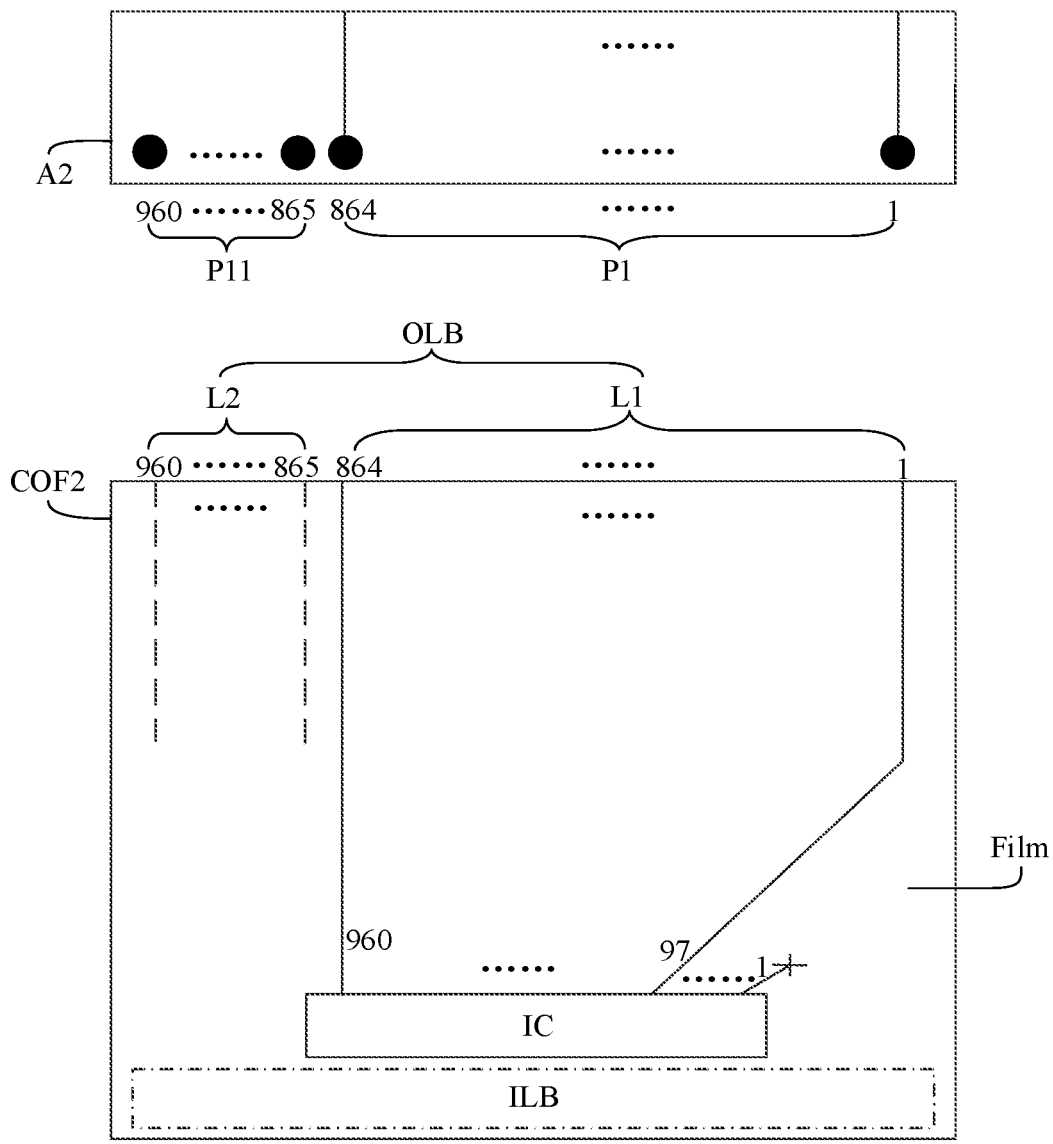
FIG. 4 is a structural schematic view of OLB lines of a first chip on film and a solder pad of a first array unit according to a third embodiment of the present disclosure.

As shown in FIG. 3, FIG. 3 is a structural schematic view of OLB lines of a first chip on film and a solder pad of a first array unit according to a second embodiment of the present disclosure. In the present embodiment, the flexible film Film of the first chip on film COF2 may include (864+96) OLB lines. The 864 OLB lines may be electrically connected to the pins of the driver chip IC to form the driver liens L1 for transmitting signals. The 96 OLB lines may not be electrically connected to the pins of the driver chip IC and may serve as the nominal lines L2. The 96 nominal lines L2 may be disposed on a same side of the 864 driver OLB lines L1. More specifically, the 96 nominal lines L2 may be disposed on a right side of the driver lines L1. In this case, the OLB lines of the flexible film Film of the first chip on film COF2 may be arranged as follows from the left to the right: OLB lines from the No. 960 to the No. 97 may be the driver lines L1, and OLB lines from the No. 96 to the No. 1 may be the nominal lines L2. Similarly, the 96 nominal lines L2 may be disposed on the left of the driver lines L1, as shown in FIG. 4. In this case, the OLB lines of the flexible film Film of the first chip on film COF2 may be arranged as follows from the left to the right: OLB lines from the No. 960 to the No. 865 may be the nominal lines L2, and OLB lines from the No. 864 to the No. 1 may be the driver lines L1.

In other embodiments, the N nominal OLB lines L2 on the first chip on film COF2 may be scattered between the M driver OLB lines L1 based on actual needs. For example, the 96 nominal OLB lines L2 may divided into 10 groups. Each group of the 10 groups of nominal lines L2 may be disposed between any two adjacent lines of the 864 driver OLB lines L1 to form the chip on film COF having the total number of 960 OLB lines.

In an embodiment, arrangement of OLB lines on the second chip on film COF1 and the third chip on film COF12 may be the same as any one of the arrangement of the OLB lines of the first chip on film COF2 in the above embodiments. Usually, for a display substrate G20 in a certain model, the first chip on film COF2, the second chip on film COF1 and the third chip on film COF12 may be chip on films COF taken from a same example. In this way, the OLB lines of all chip on film COFs of the same display panel 100 may be arranged in a same manner, such that tediousness of a production process may be reduced, and a production efficiency may be improved.

In the present embodiment, the pins on the driver chip IC may include M first pins and N second pins. The M driver lines L1 may be electrically connected to the M first pins respectively, and the N second pins may not be connected. It shall be understood that the N nominal lines L2 may not be connected to the pins of the driver chip IC, such that N pins on the driver chip IC may be unconnected pins, serving as the second pins. Due to limitation by a timing control unit TCON on the display panel 100, pins in a middle portion of the driver chip IC may not be arranged as unconnected pins.

Figure 5:
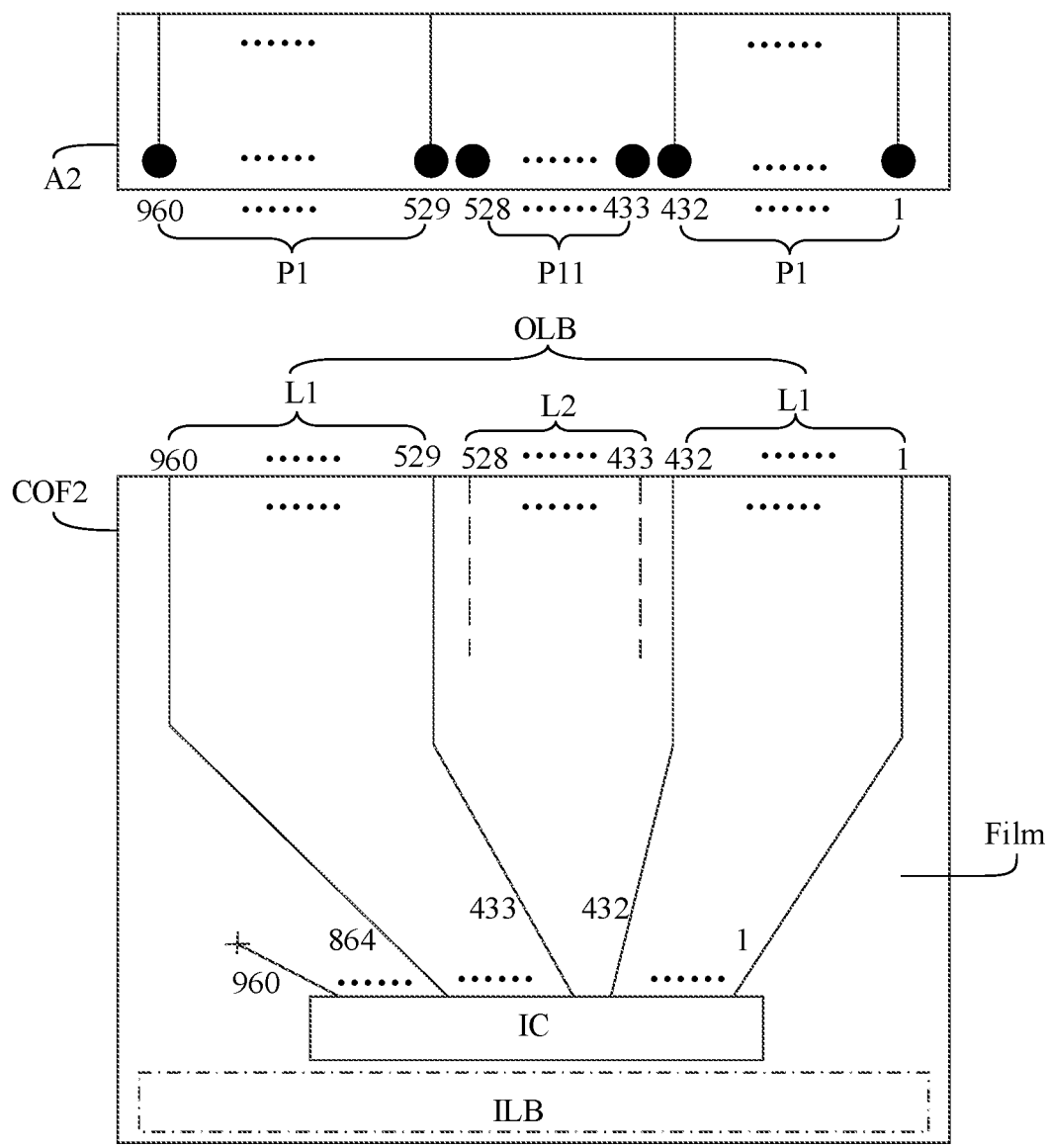
FIG. 5 is a structural schematic view of OLB lines of a first chip on film and a solder pad of a first array unit according to a fourth embodiment of the present disclosure.

Therefore, the N second pins may be disposed located on a same side or on opposite sides of the M first pins. As shown in FIGS. 2 to 4, in these embodiments, No. 1 to No. 96 pins of the driver chip IC may be configured as the unconnected pins, i.e., the second pins, and may not be connected to the OLB lines on the chip on film COF. No. 97 to No. 960 pins of the driver chip IC may be configured as the first pins and may be connected to the 864 driver lines L1 on the chip on film COF to transmit data signals. As shown in FIG. 5, in this embodiment, No. 1 to No. 864 pins of the driver chip IC may be configured as the first pins and may be respectively connected to the driver lines L1 on the chip on film COF to transmit data signals. The No. 865 to No. 960 pins of the driver chip IC may be configured as the unconnected pins, i.e., the second pins, and may not be connected to the OLB lines on the chip on film COF. It shall be understood that the driver chip IC may not be arranged with the unconnected second pins. For example, the driver chip IC may include 864 pins, and all of the 864 pins may be the first pins. However, in this case, a driver chip IC having 864 pins may be prepared specifically, and the 864-pin driver chip IC may not be commonly used, which may cause high costs of the driver chip IC.

In the present embodiment, the first array unit A2 in a middle portion of the display substrate G20 may include M data lines and (M+N) pads. The M pads may be connected to the M data lines to form first driver pads Pl, and the N pads may not be connected to the data lines, serving as first nominal pads P11. The M driver lines L1 of the first chip on film COF2 and the M first driver pads P1 may be in one-to-one correspondence, and the M driver lines L1 of the first chip on film COF2 may be connected to the M first driver pads P1. The N nominal lines L2 of the first chip on film COF2 and the N first nominal pads P11 may be in one-to-one correspondence, and the N nominal lines L2 of the first chip on film COF2 may be connected to the N first nominal pads P11. In this way, the M driver lines L1 may input corresponding data signals to the M data lines through the first driver pads P1. The N nominal lines L2 may be connected to the N first nominal pads P11, but no data signal is transmitted. In this way, the chip on film COF may drive the display substrate G20 to operate normally. In addition, the nominal lines L2 and the first nominal pads P11 may be connected to enable the chip on film COF to be connected to the display substrate G20 more firmly. As shown in FIG. 1, in the present embodiment, the display substrate G20 may be arranged with 10 first array cells A2, and the 10 first array cells A2 may correspond to the first chip on films COF2~COF11. Each of the first array cells A2 may include 864 data lines and (864+96) pads. The 864 pads may be connected to the 864 data lines respectively to form the first driver pads P1, and the 96 pads may not be connected to the data lines and may serve as the first nominal pads P11. Referring to the arrangement of the OLB lines on the first chip on film COF2 in the first embodiment of FIG. 2, the 96 first nominal pads P11 may correspond to the 96 nominal lines L2 in the figure. The 96 first nominal pads P11 may be correspondingly disposed at a middle of the 864 first driver pads P1. That is, No. 960 to No. 529 pads may be the first driver pads P1, No. 528 to No. 433 pads may be the first nominal pads P11, and No. 432 to No. 1 pads may be the first driver pads P1. In the present embodiment, No. 960 to No. 529 driver lines L1 on the first chip on film COF2 and No. 432 to No. 1 driver lines L1 on the first chip on film COF2 may be arranged in one-to-one correspondence with and may be connected to the No. 960 to the No. 529 first driver pads P1 and the No. 432 to No. 1 first driver pads P1 on the first array unit A2 respectively. No. 528 to No. 433 nominal lines L2 on the first chip on film COF2 may be arranged in one-to-one correspondence with and may be connected to the No. 528 to the No. 433 first nominal pads P11 on the first array unit A2 respectively. In this way, data signal may be transmitted accurately.

Similarly, corresponding to the arrangement of the OLB lines on the first chip on film COF2 in the second embodiment of FIG. 3, 96 first nominal pads P11 may correspond to 96 nominal lines L2 in the figure. The 96 first nominal pads P11 may be disposed at a right of the 864 first driver pads P1. That is, No. 960 to No. 97 pads may be the first driver pads P1, and No. 96 to No. 1 pads may be the first nominal pad P11. In the present embodiment, No. 960 to No. 97 driver lines L1 on the first chip on film COF2 may be arranged in one-to-one correspondence with and may be connected to the No. 960 to the No. 97 first driver pads P1 on the first array unit A2 respectively. No. 96 to No. 1 OLB nominal lines L2 on the first chip on film COF2 may be arranged in one-to-one correspondence with and may be connected to the No. 96 to the No. 1 first nominal pads P11 on the first array unit A2 respectively. In this way, data signal may be transmitted accurately. Similarly, corresponding to the third embodiment of FIG. 4, the first driver pads P1 and the first nominal pads P11 on the first array unit A2 may be arranged in one-to-one correspondence with and may be connected to the driver lines L1 and the nominal lines L2 on the first chip on film COF2 in the same embodiment. In this way, data signal may be transmitted accurately, and detailed arrangement will not be repeatedly herein.

In the present embodiment, corresponding to FIG. 1, a leftmost chip on film may be the second chip on film COF1, and the second chip on film COF1 may correspond to and may be electrically connected to the second array unit A1 at a leftmost of the display substrate G20. The second array unit A1 may include (M−X) data lines and (M+N) pads. The (M−X) pads may be connected to the (M−X) data lines to form second driver pads P2. The N pads may not be connected to the data lines and serve as the first nominal pads P11. The X pads may be disposed at a left of the (M−X) second driver pads P2, may not be connected to the data lines, and may serve as second nominal pads P12. The M driver lines L1 of the second chip on film COF1 may be arranged in one-to-one correspondence with and connected to the X second nominal pads P12 and the (M−X) second driver pads P2, respectively. In detail, the X driver lines L1 on the left of the second chip on film COF1 may be arranged in one-to-one correspondence with and connected to the X second nominal pads P12. The remaining (M−X) driver lines L1 may be arranged in one-to-one correspondence with and connected to the (M−X) second driver pads P2. The N nominal lines L2 may be arranged in one-to-one correspondence with and connected to the N first nominal pads P11. In this way, data signal may be transmitted accurately.

Figure 6:
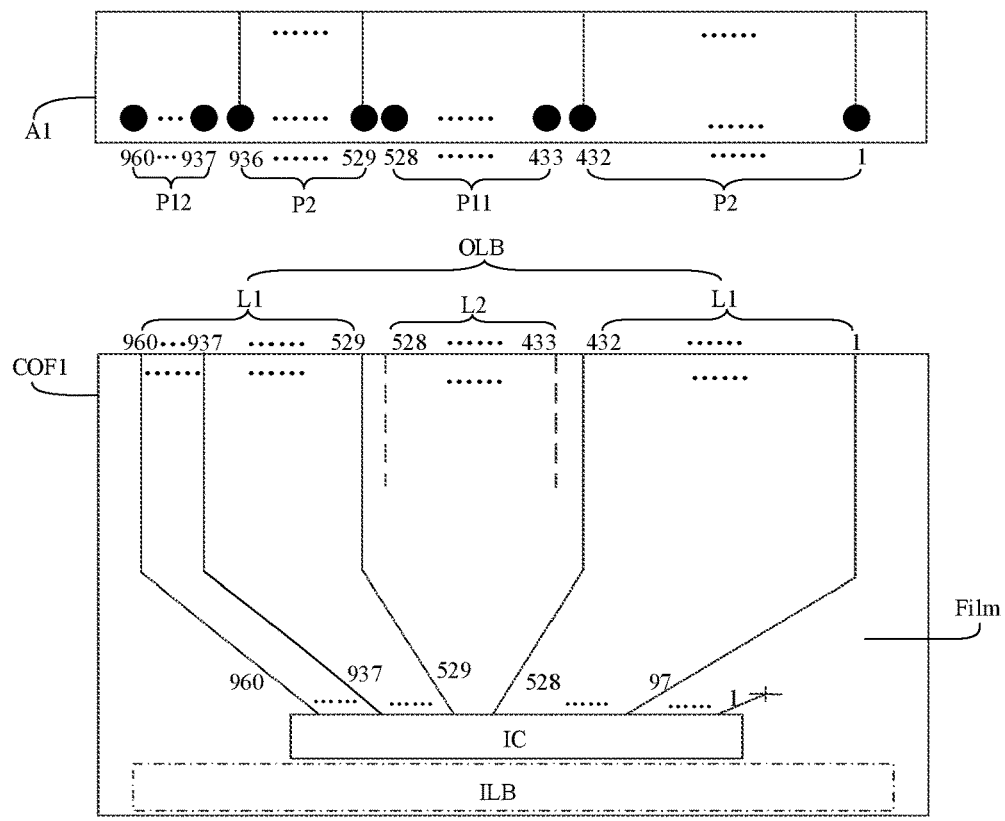
FIG. 6 is a structural schematic view of OLB lines of a second chip on film and a solder pad of a second array unit according to the first embodiment of the present disclosure.

As shown in FIG. 6, FIG. 6 is a structural schematic view of OLB lines of a second chip on film and a solder pad of a second array unit according to the first embodiment of the present disclosure. The number of data lines allocated to the second chip on film COF1 may be 840, and the second array unit A1 may correspondingly include (864−24) data lines and (864+96) pads. The 840 pads may be connected to the 840 data lines respectively to form the second driver pads P2. The 96 pads may not be connected to any data line and may serve as the first nominal pads P11. The 24 pads may be disposed at a left of the 840 second driver pads P2 and may not be connected to any data line, serving as the second nominal pads P12.

Corresponding to the arrangement of the OLB lines on the chip on film COF in the first embodiment of FIG. 6, the 96 first nominal pads P11 may correspond to the 96 nominal lines L2 in the figure. The 96 first nominal pads P11 may be disposed at a middle of the 840 second driver pads P2. The 24 second nominal pads P12 may correspond to 24 driver lines L1 on a left of the figure. The 24 second nominal pads P12 may correspond to a left of the 840 second driver pads P2. That is, No. 960 to No. 937 pads may be the second nominal pads P12, No. 936 to No. 529 pads may be the second driver pads P2, No. 528 to No. 433 pads may be the first nominal pads P11, and No. 432 to No. 1 pads may be the second driver pads P2. In the present embodiment, No. 960 to No. 937 driver lines L1 of the second chip on film COF 1 may be arranged in one-to-one correspondence with and connected to No. 960 to No. 937 second nominal pads P12, No. 936 to No. 529 driver lines L1 of the second chip on film COF 1 may be arranged in one-to-one correspondence with and connected to No. 936 to No. 529 second driver pads P2, No. 528 to No. 433 nominal lines L2 of the second chip on film COF 1 may be arranged in one-to-one correspondence with and connected to No. 528 to No. 433 first nominal pads P11, and No. 432 to No. 1 driver lines L1 of the second chip on film COF 1 may be arranged in one-to-one correspondence with and connected to No. 432 to No. 1 second drover pads P2. In this way, data signal may be transmitted accurately.

Similarly, corresponding to the second embodiment in FIG. 3, the 24 second nominal pads P12 of the second array unit A1 may correspond to the 24 driver lines L1 on a left of the figure. The 24 second nominal pads P12 may be correspondingly arranged at the left of the 840 second driver pads P2. That is, No. 960 to No. 937 pads may be the second nominal pads P12, No. 936 to No. 97 pads may be the second driver pads P2, and No. 96 to No. 1 pads may be the first nominal pads P11. In the present embodiment, No. 960 to No. 937 driver lines L1 of the second chip on film COF 1 may correspond to and may be connected to the second nominal pads P12, No. 936 to No. 97 driver lines L1 of the second chip on film COF 1 may correspond to and may be connected to the second driver pads P12, No. 96 to No. 1 nominal lines L1 of the second chip on film COF 1 may correspond to and may be connected to the first nominal pads P11. In this way, data signal may be transmitted accurately.

Similarly, corresponding to the third embodiment in FIG. 4, the 24 second nominal pads P12 of the second array unit A1 may correspond to the 24 driver lines L1 on the left of the figure. That is, No. 864 to No. 841 driver lines L1 and the 24 second nominal pads P12 may be arranged correspondingly. No. 960 to No. 865 pads may be the first nominal pads P11, which may be arranged in one-to-one correspondence with and connected to No. 960 to No. 865 nominal lines L2 of the second chip on film COF1. No. 864 to No. 841 pads may be the second nominal pads P12, which may be arranged in one-to-one correspondence with and connected to No. 864 to No. 841 driver lines L1 of the second chip on film COF1. No. 840 to No. 1 pads may be the second driver pads P2, which may be arranged in one-to-one correspondence with and connected to No. 840 to No. 1 driver lines L1 of the second chip on film COF1. In this way, data signal may be transmitted accurately. Similarly, corresponding to the fourth embodiment in FIG. 5, the 24 second nominal pads P12 on the second array unit A1 may be arranged in one-to-one correspondence with and connected to the 24 driver lines L1 on the left of the second chip on film COF1. The second driver pads P2 and the first nominal pads P11 may correspond to and may be connected to the driver lines L1 and the nominal lines L2 on the second chip on film COF1 in the same embodiment. In this way, data signal may be transmitted accurately, and detailed arrangement will not be repeatedly described herein.

In the present embodiment, corresponding to FIG. 1, the chip on film disposed on a rightmost of the FIG. 1 is the third chip on film COF12. The third chip on film COF12 may correspond to and may be electrically connected to the third array unit A12 on a rightmost of the display substrate G20. The third array unit A12 may include (M−Y) data lines and (M+N) pads. (M−Y) pads may be connected to the (M−Y) data lines respectively to form third driver pads P3. N pads may not be connected to any data line and may serve as first nominal pads P11. Y pads may be disposed at a right of the (M−Y) third driver pads P3, may not be connected to any data line, and may serve as third nominal pads P13. In detail, the Y third nominal pads P13 may be disposed at the right of the third driver pads P3 and may be near a location where pixel rows is not arranged, named as an H-Blanking region. When the display panel is operating, a last data line is configured to display images, and the location where the third nominal pads P13 are arranged may not be configured on the display substrate G20, and the third nominal pads P13 may not be configured for displaying images. In this way, the display panel displaying images may not be affected by the third nominal pads P13, which are arranged at an end of array unit. The M driver lines L1 of the third chip on film COF12 may be arranged in one-to-one correspondence with and connected to the (M−Y) third driver pads P3 and the Y third nominal pads P13, respectively. In detail, the Y driver lines L1 disposed at the right of the third chip on film COF12 may be arranged in one-to-one correspondence with and connected to the Y third nominal pads P13, respectively. The remaining (M−Y) driver lines L1 may be arranged in one-to-one correspondence with and connected to the (M−Y) third driver pads P3. The N nominal lines L2 may be arranged in one-to-one correspondence with and connected to the N first nominal pads P11. In this way, on the display panel, all chip on films may have a same arrangement of the OLB lines, the production process may be simplified to the greatest extent, and the production efficiency may be improved.

In the present embodiment, the number of data lines allocated to the third chip on film COF12 may be 841, and the third array unit A12 may include 841 data lines and 960 pads correspondingly. The 841 pads may be connected to the 841 data lines to form the third driver pads P3, and the 96 pads may not be connected to any data line and may serve as the first nominal pads P11. 23 pads may be disposed at the right of the third array unit A12, may not be connected to any data line, and may serve as the third nominal pads P13. In detail, the locations where the third driver pads P3 and the first nominal pads P11 are arranged on the third array unit A12 may be correspond to locations where the driver lines L1 and the nominal lines L2 are arranged on the third chip on film COF12, and the third driver pads P3 and the first nominal pads P11 may be connected to the driver lines L1 and the nominal lines L2, respectively. The locations where the third nominal pads P13 are arranged on the third array unit A12 may be correspond to locations where the driver lines L1 are arranged at the rightmost of the third chip on film COF12, and the third nominal pads P3 may be connected to the driver lines L1 at the rightmost of the third chip on film COF12, respectively.

Figure 7:
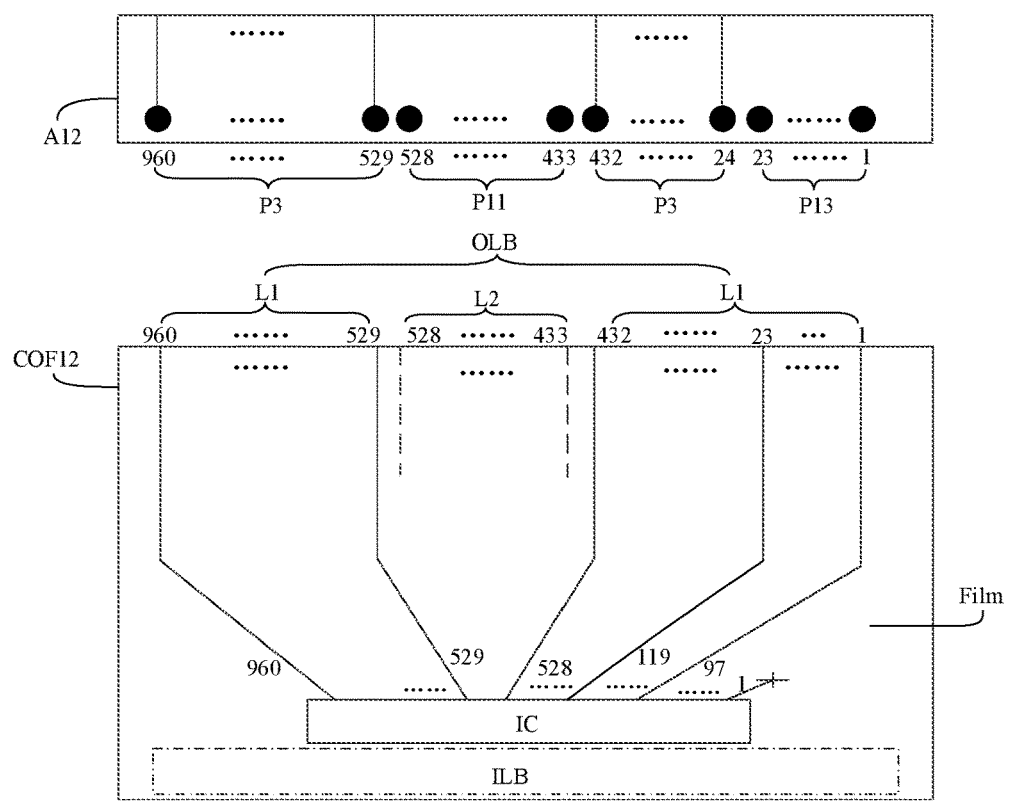
FIG. 7 is a structural schematic view of OLB lines of a third chip on film and a solder pad of a first array unit according to a third embodiment of the present disclosure.

For the first embodiment of FIG. 7, the 96 first nominal pads P11 of the third array unit A12 on the display substrate G20 may correspond to the 96 nominal lines L2 on the chip on film in the FIG. 1. The 96 first nominal pads P11 may be disposed corresponding to a middle position of the 841 second driver pads P2. The 23 third nominal pads P13 may correspond to the 23 driver lines L1 at the rightmost of the chip on film, and may be disposed at positions corresponding to the right of the 841 third driver pads P3. It shall be understood that No. 960 to No. 529 pads may be the third driver pads P3, No. 528 to No. 433 pads may be the first nominal pads P11, No. 432 to No. 24 pads may be the third driver pads P3, and No. 23 to No. 1 pads may be the third nominal pads P13. As shown in FIG. 7, in this embodiment, No. 960 to No. 529 driver lines L1 may be arranged in one-to-one correspondence with and connected to No. 960 to No. 529 third driver pads P3, No. 528 to No. 433 nominal lines L2 may be arranged in one-to-one correspondence with and connected to No. 528 to No. 433 first nominal pads P11, and No. 432 to No. 24 driver lines L1 may be arranged in one-to-one correspondence with and connected to No. 432 to No. 24 third nominal pads P13.

Similarly, for the second embodiment in FIG. 3, the 96 first nominal pads P11 of the third array unit A12 on the display substrate G20 may correspond to the 96 nominal lines L2 on the chip on film. The 96 first nominal pads P11 may be disposed at the right of the 841 third driver pads P3. The 23 third nominal pads P13 may correspond to the 23 driver lines L1 at the rightmost of the chip on film, and may be disposed corresponding to a position between the 841 third driver pads P3 and the 96 first nominal pads P11. It shall be understood that No. 960 to No. 120 pads may be the third driver pads P3, No. 119 to No. 97 pads may be the third nominal pads P13, No. 96 to No. 1 pads may be the first driver pads P1. In the present embodiment, No. 960 to No. 120 driver lines L1 of the third chip on film COF 12 may be arranged in one-to-one correspondence with and connected to No. 960 to No. 120 third driver pads P3, No. 119 to No. 97 driver lines L1 may be arranged in one-to-one correspondence with and connected to No. 119 to No. 97 third nominal pads P13, and No. 96 to No. 1 nominal lines L2 may be arranged in one-to-one correspondence with and connected to No. 96 to No. 1 first nominal pads P11.

Similarly, for the third embodiment in FIG. 4, the 96 first nominal pads P11 of the third array unit A12 on the display substrate G20 may correspond to the 96 nominal lines L2 on the chip on film in the figure. The 96 first nominal pads P11 may be disposed at the left of the 841 third driver pads P3. The 23 third nominal pads P13 may correspond to the 23 driver lines L1 at the rightmost of the chip on film, and may be disposed at positions corresponding to the right of the 841 third driver pads P3. It shall be understood that No. 960 to No. 865 pads may be the first nominal pads P11, No. 864 to No. 842 pads may be the third nominal pads P13, No. 841 to No. 1 pads may be the third driver pads P3. In the present embodiment, No. 960 to No. 865 nominal lines L2 of the third chip on film COF 12 may be arranged in one-to-one correspondence with and connected to No. 960 to No. 865 first nominal pads P11, No. 864 to No. 842 driver lines L1 may be arranged in one-to-one correspondence with and connected to No. 864 to No. 842 third nominal pads P13, and No. 841 to No. 1 driver lines L1 may be arranged in one-to-one correspondence with and connected to No. 841 to No. 1 third driver pads P3. Similarly, corresponding to the fourth embodiment in FIG. 5, the 23 third nominal pads P13 on the third array unit A12 may be arranged corresponding to and may be connected to the 23 driver lines L1 at the rightmost of the third chip on film COF12, and the third driver pads P3 and the first nominal pads p11 may be arranged corresponding to and may be connected to the driver lines L1 and the nominal lines L2 on the third chip on film COF12. Detailed arrangement may not be repeatedly described herein.

In the above embodiments, each of the number of data lines allocated to the second chip on film COF1 and the number of data lines allocated to the third chip on film COF12 may be different from the number of data lines allocated to the first chip on film COF2. The (M−X) driver lines L1 on the right of the second chip on film COF1 may be arranged corresponding to and connected to the second driver pads P2, which are connected to the (M−X) allocated data lines. The remaining X driver lines L1 on the left of the second chip on film COF1 may be arranged corresponding to and connected to the second nominal pads P12 on the second array unit A1. The (M−Y) driver lines L1 on the left of the third chip on film COF12 may be arranged corresponding to and connected to the third driver pads P3, which are connected to the allocated (M−Y) data lines. The remaining Y driver lines L1 on the right of the third chip on film COF 12 may be arranged corresponding to and connected to the third nominal pads P13 on the third array unit A12. In this way, each of the number of OLB lines on the second chip on film COF1 and the number of the OLB lines on the third chip on film COF12 may be the same as the number of OLB lines on the first chip on film COF2. In addition, each of all chip on films COF of the display panel 100 may have the same number of OLB lines of the common chip on film, such as 720/726/960/966/1026 lines. In this way, the number of OLB lines of the chip on film may match with parameters of the commonly used bonding machines, and the conventional bonding machines may be applied to bond the chip on film to a corresponding array unit of the display substrate. Higher cost of modifying the bonding machines, which may lead to higher production costs, may be avoided. In addition, each array unit may receive data signals appropriately, such that the display panel may display images properly. Furthermore, arranging N nominal lines L2 allows the number of OLB lines of the chip on film to be always equal to the number of OLB lines of a common chip on film. In this way, the chip on film of the present disclosure may be adapted to a display panel of any resolution, and therefore, the chip on film may be applied in arbitrary.

In some embodiments, as shown in FIG. 1, the display panel 100 may further include a source driver board XB. The source driver board XB may be electrically connected to a plurality of driver units. In detail, the chip on film COF may further include (M+N) inner lead bonding (ILB) lines. The (M+N) ILB lines may be electrically connected to the source driver board XB. In the present embodiment, the chip on film COF may further include 960 ILB lines, and each of the 960 ILB lines may be electrically connected to the source driver board. Further, the source driver board XB may further include a first source driver sub-board XL and a second source driver sub-board XR. Based on practical needs, the source driver board XB may include a plurality of sub-modules, which may not be limited herein.

Further, the display panel may further include a central control board CB, and the central control board CB may be electrically connected to the source driver board XB to control the display substrate G20 to display images. In detail, the central control board CB may be connected to the source driver board XB through a flexible circuit, such as a flexible printed circuit or a flexible flat cable. In some embodiments, the timing control circuit TCON of the central control board CB may not apply data signals to the X second nominal pads P12 on the second array unit A1 or to the Y third nominal pads P13 on the third array unit A12 on the display substrate G20, such that the display substrate G20 may receive correct data signals to display images properly. In the present embodiment, the timing control circuit TCON of the central control board CB may not apply data signals to the 24 second nominal pads P12 of the second array uni A1 and the 23 third nominal pads P13 of the third array on the display substrate G20. It shall be understood that, in the first embodiment, the second embodiment and the third embodiment of the present disclosure, No. 960 to the No. 937 pins of the driver chip IC on the second chip on film COF1 may have no signals, and No. 109 to No. 97 pins of the driver chip IC on the third chip on film COF12 may have no signals. In the fourth embodiment, No. 864 to No. 861 pins of the driver chip IC on the second chip on film COF1 may have no signals, and No. 23 to No. 1 pins of the driver chip IC on the third chip on film COF12 may have no signals.

In addition, in the present embodiment, the display panel 100 may further include a scan driver unit GOA. The scan driver unit GOA may be connected to the source driver board XB through a scanning line on the display substrate G20. The scan driver unit GOA may receive timing control signals sent from the timing control circuit TCON on the central control board CB and may output row timing control signals to the display substrate G20, enabling the display panel 100 to display dynamic images.

For the chip on film COF provided in the above embodiments, the nominal lines L2 and the driver lines L1 may be arranged in one-to-one correspondence with the nominal pads and the driver pads of the array unit of the display substrate G20, such that the arrangement of the OLB lines on the chip on film COF conforms to the arrangement of the OLB lines of the conventional chip on film, and may match with parameters of the common bonding machines. In this way, the common bonding machines may be applied to bond the chip on film COF to the corresponding array unit on the display substrate G20. Higher production costs caused by the cost of modifying the bonding machines may be avoided. In addition, arranging the N nominal lines L2 allows the number of OLB lines of the chip on film to be always equal to the number of OLB lines of a conventional chip on film. In this way, the chip on film of the present disclosure may be adapted to a display panel of any resolution, and the chip on film may be applied at arbitrary.

Figure 8:
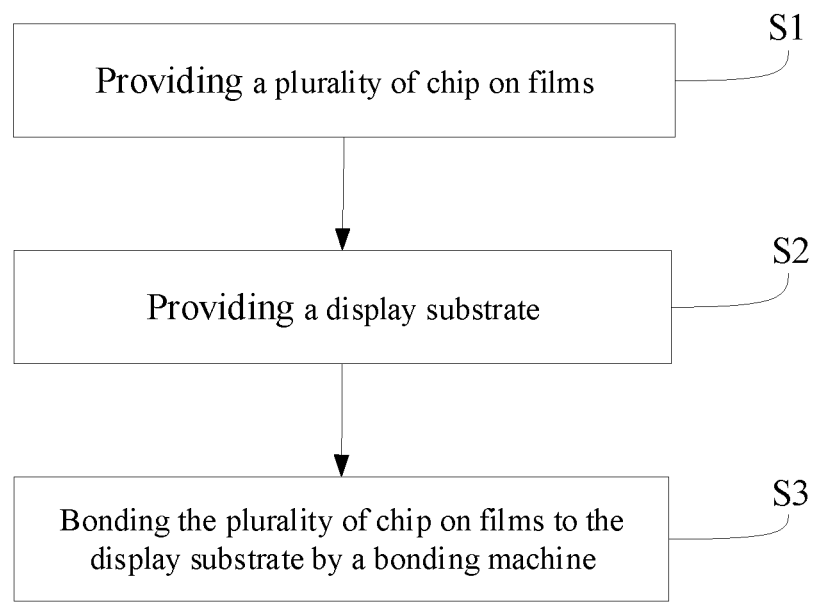
FIG. 8 is a flow chart of a method of manufacturing a display panel according to an embodiment of the present disclosure.

As shown in FIG. 8, FIG. 8 is a flow chart of a method of manufacturing a display panel according to an embodiment of the present disclosure. The method of manufacturing the display panel may include operations S1 to S3.

In the operation S1, a plurality of chip on films are provided.

In the present embodiment, as shown in FIGS. 2 to 5, the chip on film COF may be the chip on film COF provided in the above embodiments. Each of the plurality of chip on films COF may include a flexible film Film and a driver chip IC. The flexible film Film may include (M+N) OLB lines. The M OLB lines may be electrically connected to pins of the driver chip IC to form driver lines L1, and the N OLB lines may not be electrically connected to the pins of the driver chip IC and may serve as nominal lines L2. In the present embodiment, 96 nominal lines L2 may be disposed at a middle of 864 driver lines L1, shown as the chip on film COF provided in the first embodiment.

In the operation S2, a display substrate is provided.

The provided display substrate G20 may include a plurality of array units. The plurality of array units may include a plurality of first array units A2 disposed at a center of the display substrate G20, a second array unit A1 and a third array unit A12. The second array unit A1 and the third array unit A12 may be disposed on opposite sides of the plurality of first array units A2. Each of the plurality of array units may include a plurality of data lines and a plurality of pads.

Generally, the number of first array units A2 may be equal to the number of first chip on films COF2. For example, in FIG. 1, 10 first array units A2 may be arranged. Each of the first array units A2 may include M data lines and (M+N) pads. The M pads may be connected to the M data lines to form first driver pads Pl, and the N pads may not be connected to any data line and serve as first nominal pads P11. For example, in the first embodiment, each first array unit may include 864 data lines and 960 pads. The 864 pads may be connected to the 864 data lines respectively to form the first driver pads P1, and the 96 pads may not be connected to any data line and serve as the first nominal pads P11. The driver lines L1 and the nominal lines L2 on the first chip on film COF2 may be arranged in one-to-one correspondence with the first driver pads P1 and the first nominal pads P11 on the first array unit A2, respectively.

The second array unit A1 may include (M−X) data lines and (M+N) pads. (M−X) pads may be connected to the (M−X) data lines to form second driver pads P2, and N pads may not be connected to any data line and serve as first nominal pads P11. X pads may be disposed at left of the (M−X) second driver pads P2, may not be connected to any data line, and may serve as second nominal pads P12. For example, in the first embodiment, the second array may include 840 data lines and 960 pads. The 840 pads may be connected to 840 data lines to form the second driver pads P2, 96 pads may not be connected to any data line and serve as the first nominal pads P11. 24 pads may be disposed at the left of the 840 second driver pads P2, may not be connected to any data line, and may serve as the second nominal pads P12. The driver lines L1 and the nominal lines L2 on the second chip on film COF1 may be arranged in one-to-one correspondence with the second nominal pads P12, the second driver pads P2 and the first nominal pads P11 on the second array unit A1.

The third array unit A12 may include (M−Y) data lines and (M+N) pads. (M−Y) pads may be connected to the (M−X) data lines to form third driver pads P3, and N pads may not be connected to any data line and serve as first nominal pads P11. Y pads may be disposed at right of the (M−Y) third driver pads P3, may not be connected to any data line, and may serve as third nominal pads P13. For example, in the first embodiment, the third array may include 841 data lines and 960 pads. The 841 pads may be connected to 841 data lines to form the third driver pads P3, 96 pads may not be connected to any data line and serve as the first nominal pads P11. 23 pads may be disposed at the right of the 841 third driver pads P3, may not be connected to any data line, and may serve as the third nominal pads P13. The driver lines L1 and the nominal lines L2 on the third chip on film COF12 may be arranged in one-to-one correspondence with the third driver pads P3, the third nominal pads P13 and the first nominal pads P11 on the third array unit A12.

In the operation S3, the plurality of chip on films are bonded to the display substrate by a bonding machine.

In the present operation, the plurality of chip on films COF may be arranged in one-to-one correspondence with the plurality of array units. The first chip on film COF2 may be arranged in correspondence with the first array unit A2. The M driver lines L1 of the first chip on film COF2 may be arranged in one-to-one correspondence with and connected to the M first driver pads P1 of the first array unit A2. The N nominal lines L2 may be arranged in one-to-one correspondence with and connected to the N first nominal pads P11. For example, in the first embodiment, the 864 driver lines L1 of the first chip on film COF2 may be arranged in one-to-one correspondence with and connected to the 864 first driver pads P1 of the first array unit A2, and the 96 nominal lines L2 may be arranged in one-to-one correspondence with and connected to the 96 first nominal pads P11. In this way, data signals may be transmitted accurately.

The second chip on film COF1 may be arranged in correspondence with the second array unit A1. The M driver lines L1 of the second chip on film COF1 may be arranged in one-to-one correspondence with and connected to the X second nominal pads P12 and (M−X) second driver pads P2 of the second array unit A1. The N nominal lines L2 may be arranged in one-to-one correspondence with and connected to the N first nominal pads P11. For example, in the first embodiment, the 864 driver lines L1 of the second chip on film COF1 may be arranged in one-to-one correspondence with and connected to 24 second nominal pads P12 and 840 second driver pads P2 of the second array unit A1, and the 96 nominal lines L2 may be arranged in one-to-one correspondence with and connected to the 96 first nominal pads P11. In this way, data signals may be transmitted accurately.

The third chip on film COF12 may be arranged in correspondence with the third array unit A12. The M driver lines L1 of the third chip on film COF12 may be arranged in one-to-one correspondence with and connected to the (M−Y) third nominal pads P13 and Y third nominal pads P2 of the third array unit A12. The N nominal lines L2 may be arranged in one-to-one correspondence with and connected to the N first nominal pads P11. For example, in the first embodiment, the 864 driver lines L1 of the third chip on film COF12 may be arranged in one-to-one correspondence with and connected to 841 third driver pads P3 and 23 third nominal pads P13 of the third array unit A12, and the 96 nominal lines L2 may be arranged in one-to-one correspondence with and connected to the 96 first nominal pads P11.

According to the above embodiments, arrangement of the OLB lines of the chip on film COFs may be compatible with the parameters of the conventional bonding machines. Therefore, the conventional bonding machines may be applied to bond the chip on films COF to the corresponding array units of the display substrate G20. The conventional bonding machine may not be modified. Therefore, higher costs caused by modifying the conventional bonding machine may be avoided.

The above shows only embodiments of the present disclosure and does not limit the scope of the present disclosure. Any equivalent structure or equivalent process transformation performed based on the specification and accompanying drawings of the present disclosure, directly or indirectly applied in other related fields, shall be equivalently covered by the present disclosure.

What is claimed is:

1. A display panel, comprising:
   a display substrate comprising a plurality of array units, the plurality of array units being configured to control a plurality of pixel units to display an image, wherein each of the plurality of array units comprises a plurality of data lines and a plurality of pads; and
   a plurality of chip on films, arranged in one-to-one correspondence with and electrically connected to the plurality of array units to drive the display substrate to display the image, wherein each of the plurality of chip on films comprises a flexible film and a driver chip, wherein,
   the flexible film comprises at least a first group of lines and a second group of lines;
   M lines of the first group of lines are electrically connected to pins of the driver chip to form driver lines; and
   N lines of the second group of lines are not electrically connected to any pin of the driver chip, serving as nominal lines;
   the plurality of array units comprise a plurality of first array units, the plurality of chip on films comprise a plurality of first chip on films; each of the first array units comprises M data lines and (M+N) pads; the M pads are connected to the M data lines respectively to form first driver pads, the N pads are not connected to any data line and serve as first nominal pads; the M driver lines of the first chip on film are arranged in one-to-one correspondence with and connected to the M first driver pads, and the N nominal lines are arranged in one-to-one correspondence with and connected to the N first nominal pads;
   the plurality of array units comprise a second array unit, the plurality of chip on films comprise a second chip on film; the second array unit comprises (M−X) data lines and (M+N) pads; (M−X) pads of the second array unit are connected to the (M−X) data lines of the second array unit respectively to form second driver pads, the N pads of the second array unit are not connected to any data line and serve as first nominal pads of the second array unit; the X pads of the second array unit are disposed at left of the (M−X) second driver pads, not connected to any data line, and serve as second nominal pads; the M driver lines of the second chip on film are arranged in one-to-one correspondence with and connected to the X second nominal pads and the (M−X) second driver pads, and the N nominal lines of the second chip on film are arranged in one-to-one correspondence with and connected to the N first nominal pads of the second array unit;
   the plurality of array units further comprise a third array unit, the plurality of chip on films comprise a third chip on film; the third array unit comprises (M−Y) data lines and (M+N) pads; (M−Y) pads of the third array unit are connected to the (M−Y) data lines of the third array unit respectively to form third driver pads, the N pads of the third array unit are not connected to any data line and serve as first nominal pads of the third array unit; the Y pads of the third array unit are disposed at right of the (M−Y) third driver pads, not connected to any data line, and serve as third nominal pads; the M driver lines of the third chip on film are arranged in one-to-one correspondence with and connected to the (M−Y) third driver pads and the Y third nominal pads, and the N nominal lines of the third chip on film are arranged in one-to-one correspondence with and connected to the N first nominal pads of the third array unit; and
   the second array unit and the third array unit are disposed on opposite sides of the plurality of first array units; and the second chip on film and the third chip on film are disposed on opposite sides of the plurality of first chip on films.

2. The display panel according to claim 1, wherein the N nominal lines are disposed between any two adjacent driver lines of the M driver lines; or the N nominal lines are disposed on a same side of the M driver lines; or the N nominal lines are disposed on opposite sides of the M driver lines.

3. The display panel according to claim 1, wherein the driver chip comprises M first pins and N second pins, the M driver lines are electrically connected to the M first pins respectively, and the N second pins are unconnected.

4. The display panel according to claim 3, wherein the N second pins are disposed on a same side of the M first pins; or the N second pins are disposed on opposite sides of the M first pins.

5. The display panel according to claim 1, further comprising a source driver board, electrically connected to a plurality of driver units, wherein the flexible film comprises (M+N) inner lead bonding lines, the (M+N) inner lead bonding lines are electrically connected to the source driver board.

6. The display panel according to claim 5, further comprising a central control board, electrically connected to the source driver board to control the display substrate to display images, wherein a timing control circuit of the central control board does not apply data signals to the X second nominal pads and the Y third nominal pads.

7. A method of manufacturing a display panel, comprising:

providing a plurality of chip on films, wherein each of the plurality of chip on films comprises a flexible film and a driver chip; the flexible film comprises (M+N) outer lead bonding (OLB) wires; the M OLB lines are electrically connected to pins of the driver chip to form driver lines; the N OLB lines are not electrically connected to the pins of the driver chip and serve as nominal lines;

providing a display substrate, wherein the display substrate comprises a plurality of array units, and each of the plurality of array units comprises a plurality of data lines and a plurality of pads; and bonding, by a bonding machine, the plurality of chip on films to the display substrate, wherein the plurality of chip on films are arranged in one-to-one correspondence with the plurality of array units;

the plurality of array units comprise a plurality of first array units, a second array unit, and a third array unit;

each of the first array units comprises M data lines and (M+N) pads; the M pads are connected to the M data lines respectively to form first driver pads, the N pads are not connected to any data line and serve as first nominal pads;

the second array unit comprises (M−X) data lines and (M+N) pads; (M−X) pads of the second array unit are connected to the (M−X) data lines respectively to form second driver pads, the N pads of the second array unit are not connected to any data line and serve as first nominal pads; the X pads of the second array unit are disposed at left of the (M−X) second driver pads, not connected to any data line, and serve as second nominal pads;

the third array unit comprises (M−Y) data lines and (M+N) pads; (M−Y) pads of the third array unit are connected to the (M−X) data lines respectively to form third driver pads, the N pads of the third array unit are not connected to any data line and serve as first nominal pads; the Y pads of the third array unit are disposed at right of the (M−Y) third driver pads, not connected to any data line, and serve as third nominal pads;

a first chip on film is arranged in correspondence with each of the plurality of first array units, M driver lines of the first chip on film are arranged in one-to-one correspondence with and connected to the M first driver pads of the first array unit, N nominal lines of the first chip on film are arranged in one-to-one correspondence with and connected to the N first nominal pads;

a second chip on film is arranged in correspondence with the second array unit, M driver lines of the second chip on film are arranged in one-to-one correspondence with and connected to the X second nominal pads and the (M−X) second driver pads of the second array unit, N nominal lines of the second chip on film are arranged in one-to-one correspondence with and connected to the N first nominal pads of the second array unit; and a third chip on film is arranged in correspondence with the third array unit, M driver lines of the third chip on film are arranged in one-to-one correspondence with and connected to the (M−Y) third nominal pads and the Y third nominal pads of the third array unit, N nominal lines of the third chip on film are arranged in one-to-one correspondence with and connected to the N first nominal pads of the third array unit.

* * * * *